(12) United States Patent
Cheng

(10) Patent No.: US 10,281,499 B2
(45) Date of Patent: May 7, 2019

(54) HIGH SIDE CURRENT MONITORING APPARATUS

(71) Applicant: DELTA ELECTRONICS, INC., Taoyuan County (TW)

(72) Inventor: Tsung-Tai Cheng, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 493 days.

(21) Appl. No.: 14/956,694

(22) Filed: Dec. 2, 2015

(65) Prior Publication Data

US 2016/0320433 A1    Nov. 3, 2016

(30) Foreign Application Priority Data

Apr. 29, 2015    (TW) .............................. 104113641 A

(51) Int. Cl.
| | | |
|---|---|---|
| *G01R 15/14* | (2006.01) | |
| *G01R 31/26* | (2014.01) | |
| *G05F 3/26* | (2006.01) | |
| *G01R 19/00* | (2006.01) | |
| *G01R 19/25* | (2006.01) | |
| *H02H 9/02* | (2006.01) | |
| *H02H 9/04* | (2006.01) | |
| *H02H 9/08* | (2006.01) | |

(52) U.S. Cl.
CPC ................ *G01R 19/0092* (2013.01)

(58) Field of Classification Search
CPC ........ G01R 15/14; G01R 31/26; G01R 19/00; G05F 3/26; H02H 9/025; H02H 9/04; H02H 9/02; H02H 9/08
See application file for complete search history.

(56) References Cited

U.S. PATENT DOCUMENTS

| | | | |
|---|---|---|---|
| 2008/0144243 A1* | 6/2008 | Mariani ............... | G01R 31/048 361/56 |
| 2009/0284236 A1* | 11/2009 | Satoh ....................... | G05F 3/26 323/282 |
| 2012/0206193 A1* | 8/2012 | Sugiura ..................... | G05F 3/08 327/541 |
| 2014/0152288 A1* | 6/2014 | Song ........................ | G05F 3/185 323/313 |
| 2016/0233666 A1* | 8/2016 | Witcher ................ | H02H 9/025 |

* cited by examiner

*Primary Examiner* — Neel D Shah
(74) *Attorney, Agent, or Firm* — Hauptman Ham LLP

(57) ABSTRACT

A high side current monitoring apparatus monitors a load current flowing into a load apparatus. The high side current monitoring apparatus includes a current mirror unit, an active high voltage unit, a voltage detection unit and a bias unit. The current mirror unit generates a mirrored current and outputs the mirrored current according to the load current. The active high voltage unit is electrically connected to the current mirror unit and receives the mirrored current and works in a linear area to withstand a high voltage. The voltage detection unit is electrically connected to the active high voltage unit and detects a voltage drop across the voltage detection unit and caused by the mirrored current. The bias unit is electrically connected to the active high voltage unit and provides the active high voltage unit with a bias.

9 Claims, 4 Drawing Sheets

HIGH SIDE CURRENT MONITORING APPARATUS

BACKGROUND OF THE INVENTION

Field of the Invention

The present invention relates to a current monitoring apparatus, and especially relates to a high side current monitoring apparatus for the high input voltage.

Description of the Related Art

Currently, there are two types of conventional high side current monitoring apparatuses. They are Hall effect IC current sensor and shunt resistor current sensor. The disadvantages of the Hall effect IC current sensor are slow response, large volume and high cost. Therefore, currently most of the users use the shunt resistor current sensor. The advantages of the shunt resistor current sensor are fast response and small volume, but the disadvantage of the shunt resistor current sensor is that when it is applied to the high voltage, an isolated power is required. Therefore, the circuit of the shunt resistor current sensor is complicated so that the cost is high.

SUMMARY OF THE INVENTION

In order to solve the above-mentioned problems, an object of the present invention is to provide a high side current monitoring apparatus especially suitable for high voltage operation.

In order to achieve the object of the present invention mentioned above, the high side current monitoring apparatus is applied to an input high voltage status to monitor a load current flowing into a load apparatus. The high side current monitoring apparatus comprises a current mirror unit, an active high voltage unit, a bias unit and a voltage detection unit. The current mirror unit generates a mirrored current and outputs the mirrored current according to the load current. The active high voltage unit is electrically connected to the current mirror unit and receives the mirrored current. The bias unit is electrically connected to the active high voltage unit, so that the active high voltage unit works in a linear area under the input high voltage status. The voltage detection unit generates a voltage detection signal according to the mirrored current. According to the voltage detection signal, the load current is calculated and obtained.

Moreover, the high side current monitoring apparatus further comprises a voltage stabilizing unit electrically connected to the current mirror unit, the active high voltage unit and the bias unit. The voltage stabilizing unit provides the current mirror unit with a current mirror operating voltage and protects the current mirror unit.

Moreover, the current mirror unit comprises a shunt resistor electrically connected to the load apparatus and the voltage stabilizing unit. The load current flows through the shunt resistor to generate a shunt voltage drop.

Moreover, the current mirror unit further comprises a first transistor electrically connected to the load apparatus and the shunt resistor.

Moreover, the current mirror unit further comprises a second transistor electrically connected to the first transistor.

Moreover, the current mirror unit further comprises a mirrored resistor electrically connected to the voltage stabilizing unit, the shunt resistor and the second transistor. An emitter-base voltage of the first transistor is equal to an emitter-base voltage of the second transistor, so that a first mirrored current is generated according to the shunt voltage drop and the mirrored resistor. A second mirrored current is mirrored generated according to the first mirrored current and flows through the first transistor. A current magnitude of the first mirrored current is equal to a current magnitude of the second mirrored current.

Moreover, the current mirror unit further comprises a third transistor and a fourth transistor. The third transistor is electrically connected to the first transistor, the second transistor and the active high voltage unit. The fourth transistor is electrically connected to the second transistor, the third transistor and the active high voltage unit.

Moreover, the high side current monitoring apparatus further comprises a passive high voltage unit electrically connected to the active high voltage unit. The passive high voltage unit decreases a cross voltage of the active high voltage unit.

Moreover, the high side current monitoring apparatus further comprises a current mirror low voltage startup unit electrically connected to the current mirror unit, the active high voltage unit, the voltage stabilizing unit and the bias unit. When the shunt voltage drop is negative or low (namely, the load current is low), the current mirror unit fails to start properly. The current mirror low voltage startup unit provides the current mirror unit with a bias path, so that the current mirror unit maintains working (for example, maintains working with a low current).

Moreover, the high side current monitoring apparatus further comprises a current limiting unit electrically connected to the current mirror unit and the current mirror low voltage startup unit. The current limiting unit limits a current to maintain a current measurement accuracy of the high side current monitoring apparatus.

The advantage of the present invention is to provide a high side current monitoring apparatus with simple circuits, low cost and wide detection scope.

DETAILED DESCRIPTION OF THE INVENTION

Please refer to following detailed description and figures for the technical content of the present invention. The following detailed description and figures are referred for the present invention, but the present invention is not limited to it.

Figure 1:
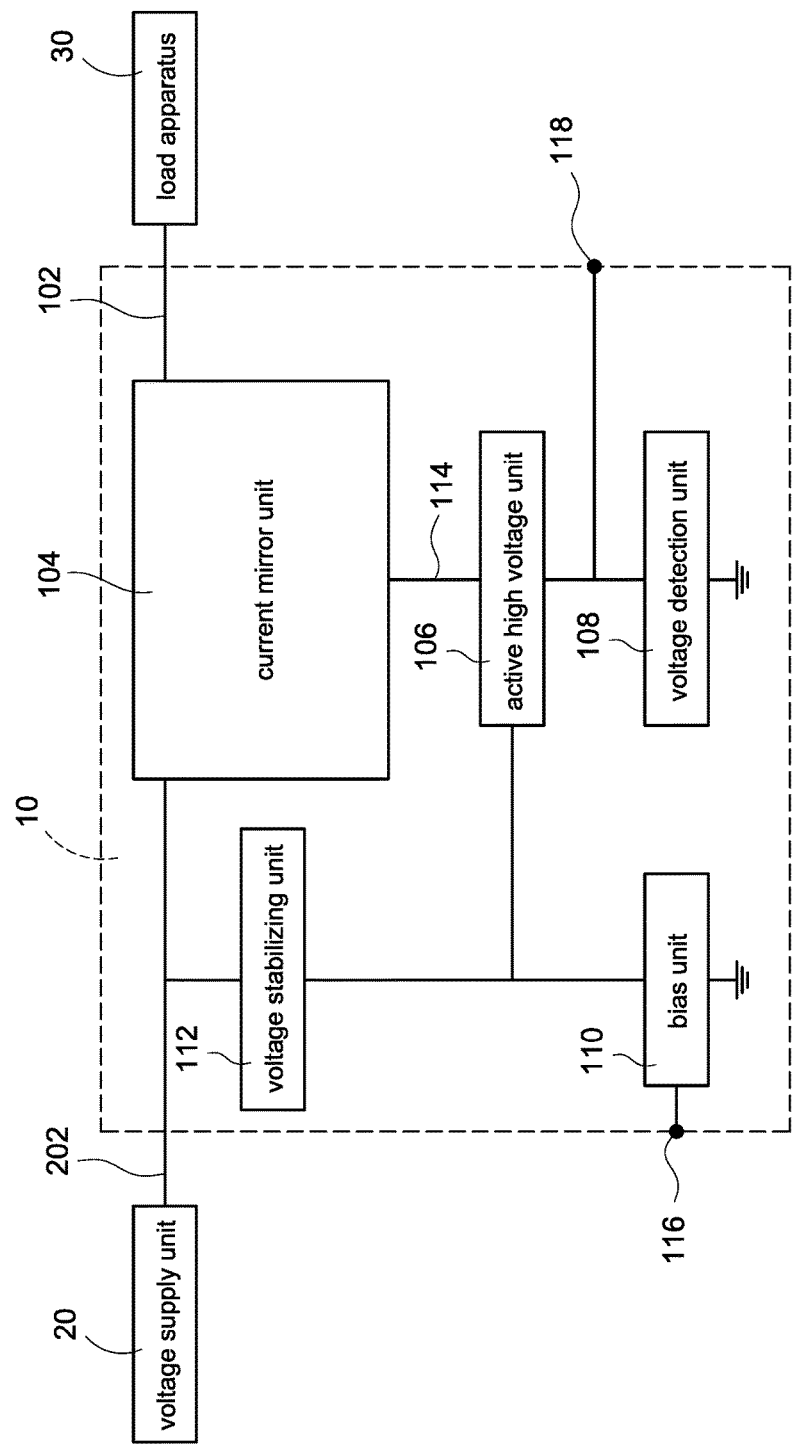
FIG. 1 shows a block diagram of an embodiment of the high side current monitoring apparatus of the present invention.
Figure 2:
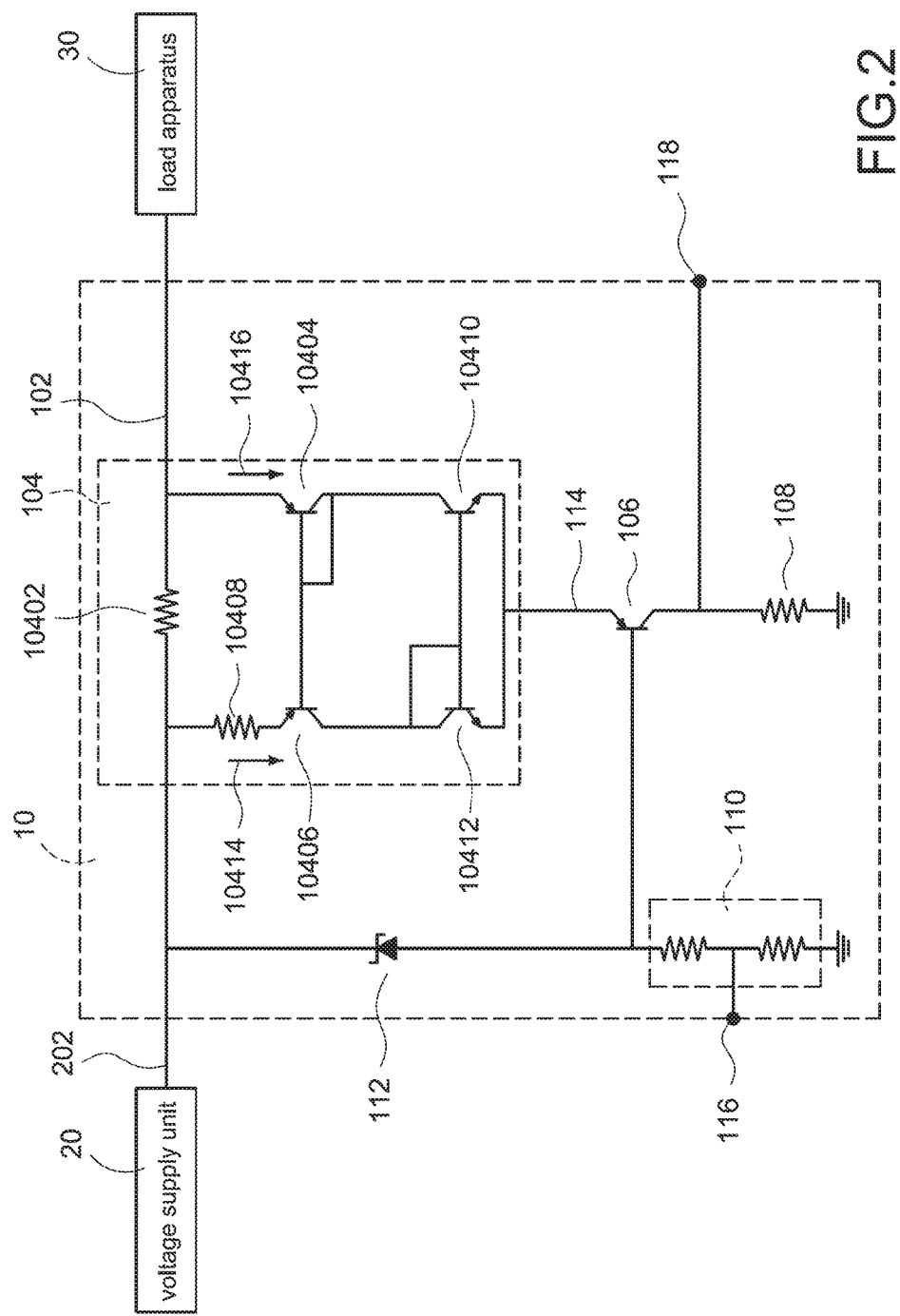
FIG. 2 shows a circuit diagram of an embodiment of the high side current monitoring apparatus of the present invention.

FIG. 1 shows a block diagram of an embodiment of the high side current monitoring apparatus of the present invention. FIG. 2 shows a circuit diagram of an embodiment of the high side current monitoring apparatus of the present invention. A high side current monitoring apparatus 10 is applied to a voltage supply unit 20 and a load apparatus 30. The voltage supply unit 20 provides the high side current monitoring apparatus 10 with an input voltage 202 (for example, a high voltage). The high side current monitoring apparatus 10 is applied to an input high voltage status to monitor a load current 102 flowing into the load apparatus 30. The high side current monitoring apparatus 10 comprises a current mirror unit 104, an active high voltage unit 106, a voltage detection unit 108, a bias unit 110, a voltage stabilizing unit 112, a voltage detection side 116 and a current detection side 118.

The current mirror unit 104 generates a mirrored current 114 and outputs the mirrored current 114 according to the load current 102. The active high voltage unit 106 is electrically connected to the current mirror unit 104 and receives the mirrored current 114. The bias unit 110 is electrically connected to the active high voltage unit 106, so that the active high voltage unit 106 works in a linear area under the input high voltage status. The voltage detection unit 108 generates a voltage detection signal according to the mirrored current 114. According to the voltage detection signal, the load current 102 is calculated and obtained.

The voltage detection unit 108 is electrically connected to the active high voltage unit 106. The voltage detection unit 108 detects a voltage drop across the voltage detection unit 108 caused by the mirrored current 114. The bias unit 110 provides the active high voltage unit 106 with a bias, so that the active high voltage unit 106 works in the linear area. The voltage stabilizing unit 112 is electrically connected to the current mirror unit 104, the active high voltage unit 106 and the bias unit 110. The voltage stabilizing unit 112 provides the current mirror unit 104 with a current mirror operating voltage and protects the current mirror unit 104. The voltage detection side 116 is electrically connected to the bias unit 110. The current detection side 118 is electrically connected to the active high voltage unit 106 and the voltage detection unit 108.

The voltage stabilizing unit 112 limits a cross voltage of the current mirror unit 104, and the other voltage drop will be cross at the active high voltage unit 106, so that the current mirror unit 104 can operate in a lower voltage range. Therefore, a conventional current mirror with low withstand voltage can be used in the input high voltage status and the current mirror accuracy is increased.

The current mirror unit 104 comprises a shunt resistor 10402, a first transistor 10404, a second transistor 10406, a mirrored resistor 10408, a third transistor 10410 and a fourth transistor 10412.

The shunt resistor 10402 is electrically connected to the load apparatus 30 and the voltage stabilizing unit 112. The first transistor 10404 is electrically connected to the load apparatus 30 and the shunt resistor 10402. The second transistor 10406 is electrically connected to the first transistor 10404. The mirrored resistor 10408 is electrically connected to the voltage stabilizing unit 112, the shunt resistor 10402 and the second transistor 10406. The third transistor 10410 is electrically connected to the first transistor 10404, the second transistor 10406 and the active high voltage unit 106. The fourth transistor 10412 is electrically connected to the second transistor 10406, the third transistor 10410 and the active high voltage unit 106.

The load current 102 flows through the shunt resistor 10402 to generate a shunt voltage drop. An emitter-base voltage of the first transistor 10404 is equal to an emitter-base voltage of the second transistor 10406, so that a first mirrored current 10414 is generated according to the shunt voltage drop and the mirrored resistor 10408. A second mirrored current 10416 is mirrored generated according to the first mirrored current 10414 and flows through the first transistor 10404. A current magnitude of the first mirrored current 10414 is equal to a current magnitude of the second mirrored current 10416. In this embodiment, the mirrored current 114 is made of the first mirrored current 10414 and the second mirrored current 10416.

The formula of the high side current monitoring apparatus of the present invention is similar to the formula of the related art high side current monitoring apparatus. Assume that the voltage detection unit 108 is a resistor, and then a resistor ratio is defined as the voltage detection unit 108 being divided by the mirrored resistor 10408. The voltage of the current detection side 118 is equal to the load current 102 being multiplied by the shunt resistor 10402 and then being multiplied by the double of the resistor ratio. The voltage detection signal generated at the current detection side 118 can be detected and obtained. The shunt resistor 10402, the voltage detection unit 108 and the mirrored resistor 10408 are known as well. Therefore, the load current 102 can be calculated and obtained. Namely, according to the voltage detection signal, the load current 102 can be calculated and obtained.

The active high voltage unit 106 is, for example but not limited to, a PNP bipolar junction transistor. The voltage detection unit 108 is, for example but not limited to, a resistor. The bias unit 110 comprises, for example but not limited to, two resistors. The voltage stabilizing unit 112 is, for example but not limited to, a 5 volts Zener diode. The first transistor 10404 is, for example but not limited to, a PNP bipolar junction transistor. The second transistor 10406 is, for example but not limited to, a PNP bipolar junction transistor. The third transistor 10410 is, for example but not limited to, a NPN bipolar junction transistor. The fourth transistor 10412 is, for example but not limited to, a NPN bipolar junction transistor.

Figure 3:
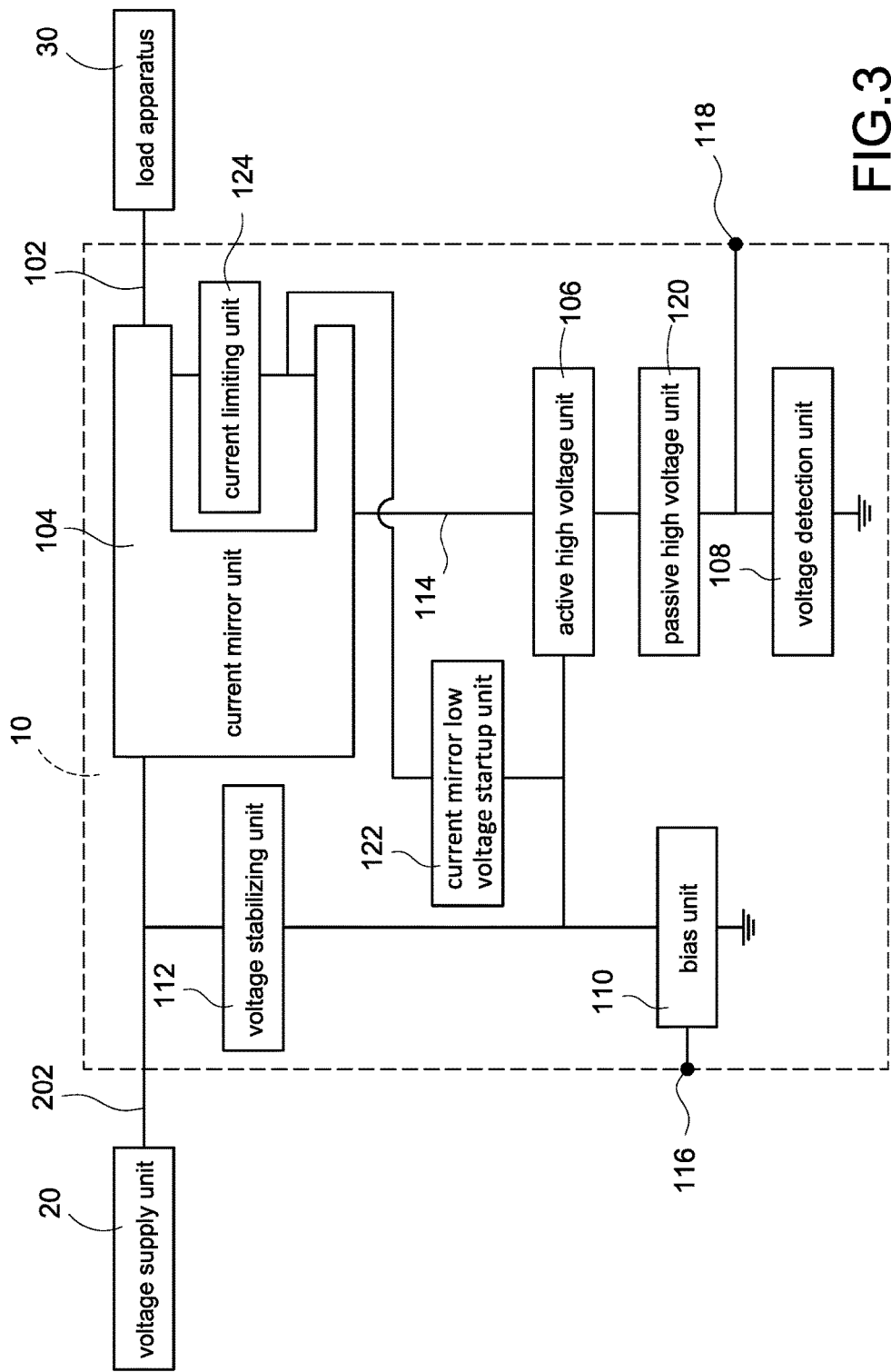
FIG. 3 shows a block diagram of another embodiment of the high side current monitoring apparatus of the present invention.
Figure 4:
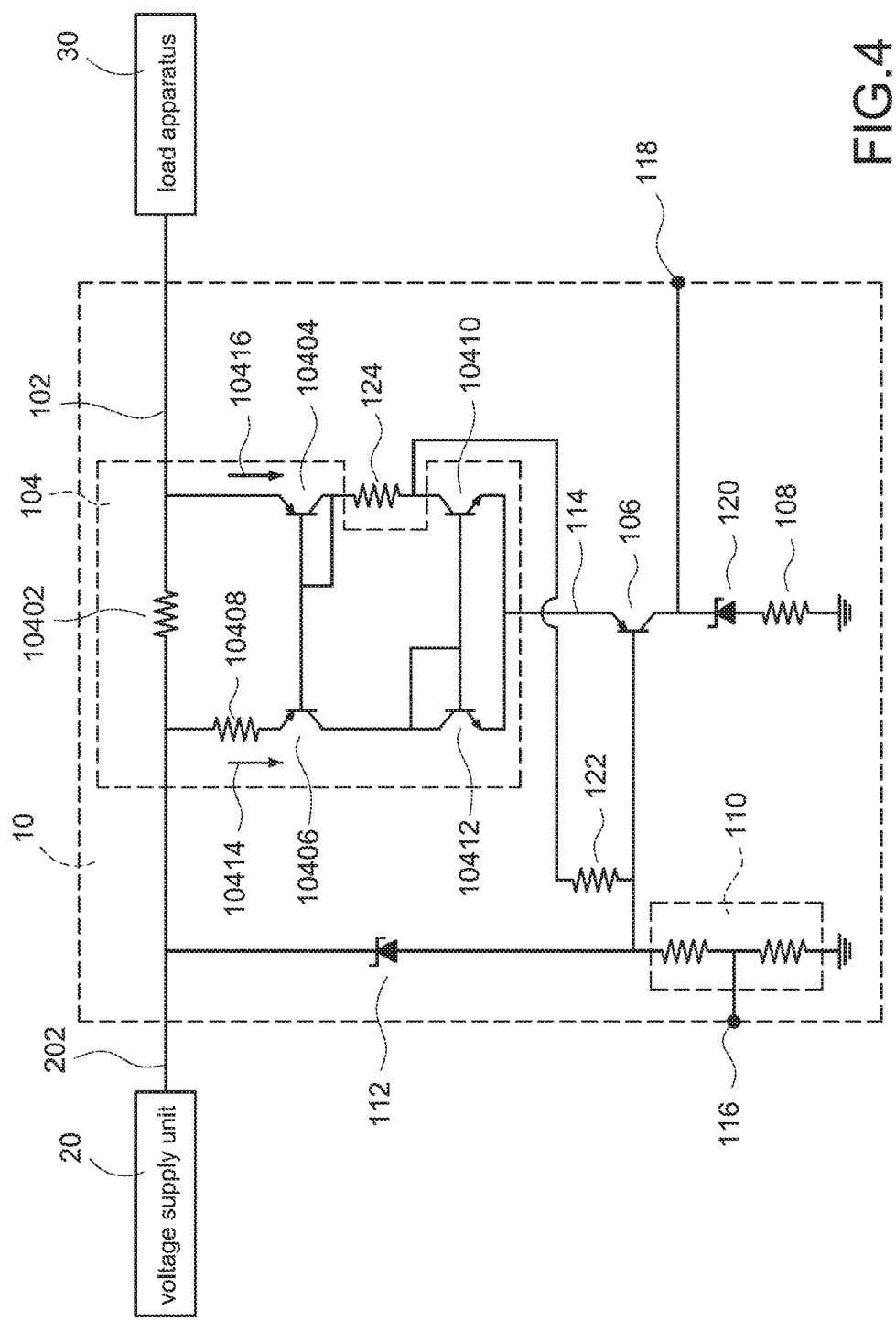
FIG. 4 shows a circuit diagram of another embodiment of the high side current monitoring apparatus of the present invention.

FIG. 3 shows a block diagram of another embodiment of the high side current monitoring apparatus of the present invention. FIG. 4 shows a circuit diagram of another embodiment of the high side current monitoring apparatus of the present invention. A high side current monitoring apparatus 10 is applied to a voltage supply unit 20 and a load apparatus 30. The voltage supply unit 20 provides the high side current monitoring apparatus 10 with an input voltage 202 (for example, a high voltage). The high side current monitoring apparatus 10 monitors a load current 102 flowing into the load apparatus 30. The high side current monitoring apparatus 10 comprises a current mirror unit 104, an active high voltage unit 106, a voltage detection unit 108, a bias unit 110, a voltage stabilizing unit 112, a voltage detection side 116, a current detection side 118, a passive high voltage unit 120, a current mirror low voltage startup unit 122 and a current limiting unit 124.

The current mirror unit 104 generates a mirrored current 114 and outputs the mirrored current 114 according to the load current 102. The active high voltage unit 106 is electrically connected to the current mirror unit 104. The active high voltage unit 106 receives the mirrored current 114 and works in a linear area to endure a high voltage. The voltage detection unit 108 is electrically connected to the active high voltage unit 106. The voltage detection unit 108 detects a voltage drop across the voltage detection unit 108 caused by the mirrored current 114. The bias unit 110 is electrically connected to the active high voltage unit 106. The bias unit 110 provides the active high voltage unit 106 with a bias, so that the active high voltage unit 106 works in a linear area. The voltage stabilizing unit 112 is electrically connected to the current mirror unit 104, the active high voltage unit 106 and the bias unit 110. The voltage stabilizing unit 112 provides the current mirror unit 104 with a current mirror operating voltage and protects the current mirror unit 104. The voltage detection side 116 is electrically connected to the bias unit 110. The current detection side 118 is electrically connected to the active high voltage unit 106 and the voltage detection unit 108.

The voltage stabilizing unit 112 limits a cross voltage of the current mirror unit 104, and the other voltage drop will be cross at the active high voltage unit 106, so that the current mirror unit 104 can operate in a lower voltage range. Therefore, a conventional current mirror with low withstand voltage can be used in the input high voltage status and the current mirror accuracy is increased. The current mirror unit 104 comprises a shunt resistor 10402, a first transistor 10404, a second transistor 10406, a mirrored resistor 10408, a third transistor 10410 and a fourth transistor 10412.

The shunt resistor 10402 is electrically connected to the load apparatus 30 and the voltage stabilizing unit 112. The first transistor 10404 is electrically connected to the load apparatus 30 and the shunt resistor 10402. The second transistor 10406 is electrically connected to the first transistor 10404. The mirrored resistor 10408 is electrically connected to the voltage stabilizing unit 112, the shunt resistor 10402 and the second transistor 10406. The third transistor 10410 is electrically connected to the first transistor 10404, the second transistor 10406 and the active high voltage unit 106. The fourth transistor 10412 is electrically connected to the second transistor 10406, the third transistor 10410 and the active high voltage unit 106.

The load current 102 flows through the shunt resistor 10402 to generate a shunt voltage drop. An emitter-base voltage of the first transistor 10404 is equal to an emitter-base voltage of the second transistor 10406, so that a first mirrored current 10414 is generated according to the shunt voltage drop and the mirrored resistor 10408. A second mirrored current 10416 is mirrored generated according to the first mirrored current 10414 and flows through the first transistor 10404. A current magnitude of the first mirrored current 10414 is equal to a current magnitude of the second mirrored current 10416. In this embodiment, the mirrored current 114 is made of the first mirrored current 10414 and the second mirrored current 10416.

The passive high voltage unit 120 is electrically connected to the active high voltage unit 106 and the voltage detection unit 108. The passive high voltage unit 120 helps the active high voltage unit 106 to endure the high voltage. When the input voltage in high side is very high, the passive high voltage unit 120 is used to help the active high voltage unit 106 to endure the high voltage to reduce the cross voltage of the active high voltage unit 106, so that the active high voltage unit 106 does not require special high voltage resistance.

The passive high voltage unit 120 provides the high side current monitoring apparatus 10 with a lowest working voltage and a voltage stabilizing function. For example, the maximum withstand voltage of a conventional PNP bipolar junction transistor is 500 volts. When the input voltage in high side is between 200 volts and 600 volts, the passive high voltage unit 120 with the withstand voltage of 150 volts is selected, and then the maximum withstand voltage of the active high voltage unit 106 is about 450 volts. The active high voltage unit 106 can work normally when the input voltage in high side is lower (200 volts). According to the selection of the active high voltage unit 106 and the passive high voltage unit 120, the present invention can be applied to a wide range input voltage.

The current mirror low voltage startup unit 122 is electrically connected to the current mirror unit 104, the active high voltage unit 106, the voltage stabilizing unit 112 and the bias unit 110. When the shunt resistor 10402 of the current mirror unit 104 is in low voltage or negative voltage (for example, the load current 102 is too low or return), the current mirror unit 104 will fail to start properly. The current mirror low voltage startup unit 122 provides the current mirror unit 104 with a bias path, so that the high side current monitoring apparatus 10 starts properly in low voltage or negative voltage mentioned above. If the value of the current mirror low voltage startup unit 122 is lower, the starting-up response is faster, but the accuracy is impacted because the currents of the current mirror unit are unbalance caused by the bias path.

The current limiting unit 124 is arranged (added) because a current measurement accuracy of the high side current monitoring apparatus 10 is impacted by the current mirror low voltage startup unit 122. The current limiting unit 124 is electrically connected to the current mirror unit 104 and the current mirror low voltage startup unit 122. The current limiting unit 124 limits the current flowing through the bias path to maintain the current measurement accuracy of the high side current monitoring apparatus 10 (namely, reducing the impact of the current mirror low voltage startup unit 122). Please refer to FIG. 4 for the operating principle.

When the shunt resistor 10402 is in low voltage or negative voltage, the current mirror low voltage startup unit 122 provides the current mirror unit 104 with a bias path, so that the high side current monitoring apparatus 10 starts properly and quickly. When the load current 102 is increased, the second mirrored current 10416 is increased accordingly, so that the cross voltage of the current limiting unit 124 is increased at the same time. Because the voltage stabilizing unit 112 limits the overall cross voltage of the current mirror unit 104, the cross voltage of the current mirror low voltage startup unit 122 is reduced, so that the current flowing into the bias path is reduced, and then the impact of the current mirror low voltage startup unit 122 is reduced.

The formula of the high side current monitoring apparatus of the present invention is similar to the formula of the related art high side current monitoring apparatus. Assume that the voltage detection unit 108 is a resistor, and then a resistor ratio is defined as the voltage detection unit 108 being divided by the mirrored resistor 10408. The voltage of the current detection side 118 is equal to the load current 102 being multiplied by the shunt resistor 10402 and then being multiplied by the double of the resistor ratio. The voltage detection signal generated at the current detection side 118 can be detected and obtained. The shunt resistor 10402, the voltage detection unit 108 and the mirrored resistor 10408 are known as well. Therefore, the load current 102 can be calculated and obtained. Namely, according to the voltage detection signal, the load current 102 can be calculated and obtained.

The active high voltage unit 106 is, for example but not limited to, a PNP bipolar junction transistor. The voltage detection unit 108 is, for example but not limited to, a resistor. The bias unit 110 comprises, for example but not limited to, two resistors. The voltage stabilizing unit 112 is, for example but not limited to, a 5 volts Zener diode. The first transistor 10404 is, for example but not limited to, a PNP bipolar junction transistor. The second transistor 10406 is, for example but not limited to, a PNP bipolar junction transistor. The third transistor 10410 is, for example but not limited to, a NPN bipolar junction transistor. The fourth transistor 10412 is, for example but not limited to, a NPN bipolar junction transistor. The passive high voltage unit 120 is, for example but not limited to, a Zener diode. The current mirror low voltage startup unit 122 is, for example but not limited to, a resistor. The current limiting unit 124 is, for example but not limited to, a resistor.

The advantage of the present invention is to provide a high side current monitoring apparatus with simple circuits, low cost and wide detection scope.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A high side current monitoring apparatus operated with an input high voltage to monitor a load current flowing into a load apparatus, the high side current monitoring apparatus comprising: a current mirror unit generating a mirrored current and outputting the mirrored current according to the load current; an active high voltage unit electrically connected to the current mirror unit and receiving the mirrored current; a bias unit electrically connected to a control terminal of the active high voltage unit and configured to provide the active high voltage unit with a bias, so that the active high voltage unit works in a linear area under the input high voltage; a voltage detection unit generating a voltage detection signal according to the mirrored current; and a voltage stabilizing unit electrically connected to the current mirror unit, the active high voltage unit and the bias unit, wherein the voltage stabilizing unit is configured to provide the current mirror unit with a current mirror operating voltage and protect the current mirror unit, wherein the voltage stabilizing unit comprises a zener diode, wherein according to the voltage detection signal, the load current is calculated.

2. The high side current monitoring apparatus in claim 1, wherein the current mirror unit comprises:
   a shunt resistor electrically connected to the load apparatus and the voltage stabilizing unit,
   wherein the load current flows through the shunt resistor to generate a shunt voltage drop.

3. The high side current monitoring apparatus in claim 2, wherein the current mirror unit further comprises:
   a first transistor electrically connected to the load apparatus and the shunt resistor.

4. The high side current monitoring apparatus in claim 3, wherein the current mirror unit further comprises:
   a second transistor electrically connected to the first transistor.

5. The high side current monitoring apparatus in claim 4, wherein the current mirror unit further comprises:
   a mirrored resistor electrically connected to the voltage stabilizing unit, the shunt resistor and the second transistor,
   wherein an emitter-base voltage of the first transistor is equal to an emitter-base voltage of the second transistor, so that a first mirrored current is generated according to the shunt voltage drop and the mirrored resistor; a second mirrored current is mirrored generated according to the first mirrored current and flows through the first transistor; a current magnitude of the first mirrored current is equal to a current magnitude of the second mirrored current.

6. The high side current monitoring apparatus in claim 5, wherein the current mirror unit further comprises:
   a third transistor electrically connected to the first transistor, the second transistor and the active high voltage unit; and
   a fourth transistor electrically connected to the second transistor, the third transistor and the active high voltage unit.

7. The high side current monitoring apparatus in claim 1, further comprising:
   a passive high voltage unit electrically connected to the active high voltage unit,
   wherein the passive high voltage unit decreases a cross voltage of the active high voltage unit.

8. The high side current monitoring apparatus in claim 1, further comprising:
   a current mirror low voltage startup unit electrically connected to the current mirror unit, the active high voltage unit, the voltage stabilizing unit and the bias unit,
   wherein when the load current is low, the current mirror low voltage startup unit provides the current mirror unit with a bias path, so that the current mirror unit maintains working.

9. The high side current monitoring apparatus in claim 8, further comprising:
   a current limiting unit electrically connected to the current mirror unit and the current mirror low voltage startup unit,
   wherein the current limiting unit limits a current to maintain a current measurement accuracy of the high side current monitoring apparatus.

* * * * *